United States Patent
Yoo et al.

(10) Patent No.: US 9,257,312 B2
(45) Date of Patent: Feb. 9, 2016

(54) METAL OXIDE THIN FILM SUBSTRATE, METHOD OF FABRICATING THE SAME, PHOTOVOLTAIC CELL AND OLED INCLUDING THE SAME

(71) Applicant: Samsung Corning Precision Materials Co., Ltd., Gyeongsangbuk-do (KR)

(72) Inventors: YoungZo Yoo, ChungCheongNam-Do (KR); Seo Hyun Kim, ChungCheongNam-Do (KR); June Hyoung Park, ChungCheongNam-Do (KR); Il Hee Baek, ChungCheongNam-Do (KR); Gun Sang Yoon, ChungCheongNam-Do (KR); Hyunhee Lee, ChungCheongNam-Do (KR); Eun Ho Choi, ChungCheongNam-Do (KR)

(73) Assignee: Corning Precision Materials Co., Ltd. (KR)

( * ) Notice: Subject to any disclaimer, the term of this patent is extended or adjusted under 35 U.S.C. 154(b) by 0 days.

(21) Appl. No.: 13/960,994

(22) Filed: Aug. 7, 2013

(65) Prior Publication Data

US 2014/0042476 A1    Feb. 13, 2014

(30) Foreign Application Priority Data

Aug. 13, 2012    (KR) .......................... 10-2012-0088536

(51) Int. Cl.
*H01L 33/42*    (2010.01)
*H01L 21/64*    (2006.01)
(Continued)

(52) U.S. Cl.
CPC .............. *H01L 21/64* (2013.01); *C03C 17/245* (2013.01); *G02B 5/0247* (2013.01);
(Continued)

(58) Field of Classification Search
CPC .............. H01L 31/022466; H01L 31/022491; H01L 33/42; H01L 51/5215; H01L 51/447
USPC .............................. 257/98, E33.067, E33.074
See application file for complete search history.

(56) References Cited

U.S. PATENT DOCUMENTS

| | | | |
|---|---|---|---|
| 6,653,701 B1 * | 11/2003 | Yamazaki et al. | 257/414 |
| 2011/0011456 A1 * | 1/2011 | Han et al. | 136/258 |
| 2011/0094577 A1 | 4/2011 | Chatterjee et al. | |

FOREIGN PATENT DOCUMENTS

KR    101035979 B1    5/2011

OTHER PUBLICATIONS

B.S Richards, N.T.P Huong, A. Crosky: "Highly Porous Nanocluster Tio [sub2] Films Deposited Using APCVD in an Excess of Water Vapor", Journal of the Electrochemical Society, vol. 152, No. 7, May 24, 2005, pp. F71-F74, XP055086906, ISSN : 0013-4651, DOI : 10.1149/1.1921687.

(Continued)

*Primary Examiner* — Amar Movva
(74) *Attorney, Agent, or Firm* — Lerner, David, Littenberg, Krumholz & Mentlik, LLP

(57) ABSTRACT

A metal oxide thin film substrate which can increase light trapping efficiency and light extraction efficiency, a method of fabricating the same and a photovoltaic cell and organic light-emitting device (OLED) including the same. The metal oxide thin film substrate includes a base substrate, and a metal oxide thin film formed on the base substrate. The metal oxide thin film has voids which are formed inside the metal oxide thin film to scatter light.

12 Claims, 16 Drawing Sheets

(51) Int. Cl.
*H01L 33/40* (2010.01)
*H01L 31/0224* (2006.01)
*H01L 51/52* (2006.01)
*H01L 51/44* (2006.01)
*C03C 17/245* (2006.01)
*G02B 5/02* (2006.01)
*H01L 31/18* (2006.01)
*H01L 31/0236* (2006.01)

(52) U.S. Cl.
CPC ........ *G02B 5/0278* (2013.01); *H01L 31/02366* (2013.01); *H01L 31/022466* (2013.01); *H01L 31/022475* (2013.01); *H01L 31/022483* (2013.01); *H01L 31/022491* (2013.01); *H01L 31/1884* (2013.01); *H01L 33/405* (2013.01); *H01L 33/42* (2013.01); *H01L 51/442* (2013.01); *H01L 51/447* (2013.01); *H01L 51/5209* (2013.01); *H01L 51/5215* (2013.01); *H01L 51/5268* (2013.01); *C03C 2217/24* (2013.01); *C03C 2217/94* (2013.01); *C03C 2217/944* (2013.01); *C03C 2218/1525* (2013.01); *H01L 2251/305* (2013.01); *H01L 2251/306* (2013.01); *Y02E 10/549* (2013.01); *Y10T 428/24562* (2015.01); *Y10T 428/24997* (2015.04)

(56) References Cited

OTHER PUBLICATIONS

Ding L et al: "Highly transparent Zn0 bilayers by LP-M0CVD as front electrodes for thin-film micromorph silicon solar cells" Solar Energy Materials and Solar Cells, Elesevier Science Publishers, Amsterdam,NL, vol. 98, Nov. 18, 2011, pp. 331-336 XP028356574, ISSN:0927-0248 DOI:10.1016/J.solmat.2011.11.033 [retrived on Nov. 28, 2011.

Dongyun Wan, Fu-Qiang Huang, Yoaming Wang: "Advanced solar materials for thin-film photovoltaic cells", Frontiers of Physics in China; Selected Publications From Chinese Universities, Higher Education Press, BE, vol. 6 ,No. 2 , Mar. 24, 2011, pp. 117-196, XP019910129, ISSN 1673-3606,DOI: 10.1007/S11467-011-0173-4.

Wei Zhang, Tom Salagaj,Jiuan Wei, Christopher Jensen, Karlheinz Strobl: "Comparison of APCVD to LPCVD Process in the manufacturing of Zn0 TCO for solar Applications", MRS Proceedings, vol. 1201, Nov. 30, 2009, Dec. 4, 2009, p. h05-46, XP055086893, MRS Fall Meeting 2009 DOI : 10.1557 /PROC-1201-H05-46.

* cited by examiner

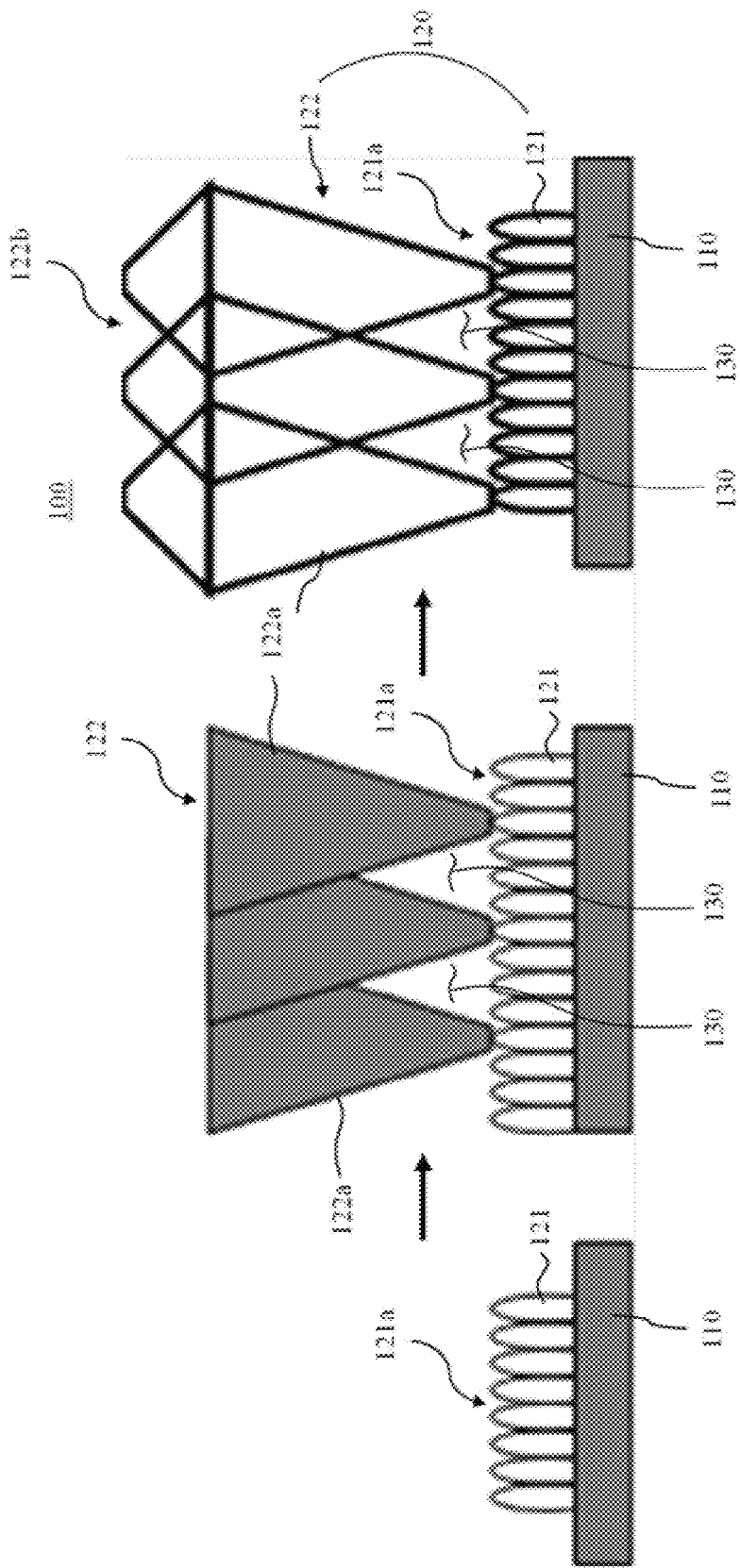

METAL OXIDE THIN FILM SUBSTRATE, METHOD OF FABRICATING THE SAME, PHOTOVOLTAIC CELL AND OLED INCLUDING THE SAME

CROSS REFERENCE TO RELATED APPLICATION

The present application claims priority from Korean Patent Application Number 10-2012-0088536 filed on Aug. 13, 2012, the entire contents of which are incorporated herein for all purposes by this reference.

BACKGROUND OF THE INVENTION

1. Field of the Invention

The present invention relates to a metal oxide thin film substrate, a method of fabricating the same and a photovoltaic cell and organic light-emitting device (OLED) including the same, and more particularly, to a metal oxide thin film substrate which can increase light trapping efficiency and light extraction efficiency, a method of fabricating the same and a photovoltaic cell and OLED including the same.

2. Description of Related Art

In general, the use of a transparent metal oxide thin film is determined depending on its conductivity. For example, the transparent metal oxide thin film can be used for a transparent conductive oxide electrode of a photovoltaic cell or a light extraction layer which is intended to increase light extraction efficiency of an organic light-emitting device (OLED).

Zinc oxide (ZnO) is a typical substance used for the metal oxide thin film which forms a transparent conductive oxide electrode of a photovoltaic cell and a light extraction layer of an OLED. Here, ZnO is formed as a thin film which coats a glass substrate by, for example, sputtering or atmospheric pressure chemical vapor deposition (APCVD) that is regarded as being suitable for mass production due to its rapid coating rate and high productivity, thereby forming a transparent electrode for a photovoltaic cell or a light extraction layer of an organic light-emitting device.

The metal oxide thin film has superior light efficiency as the haze value thereof increases. The haze value is determined by the texture formed on the surface of the metal oxide. When the metal oxide thin film is used for a transparent conductive oxide electrode of a photovoltaic cell, doping by adding an external element is required in order to increase electrical conductivity. However, doping smoothens the surface shape of the texture, thereby lowering the haze characteristic of the metal oxide thin film. In contrast, when the haze value of the metal oxide thin film is increased by controlling the texture shape of the surface of the metal oxide thin film in order to improve light efficiency, the sheet resistance $\Omega/\square$ of the metal oxide thin film increases, thereby deteriorating the electrical characteristics of the metal oxide thin film, which is problematic.

In addition, when the metal oxide thin film is used for a light extraction layer, a high haze value is required. In order to increase the scattering characteristic using only the texture on the surface, a texture thickness of at least 3 μm is required. In this case, however, light absorption is increased, that is, light transmission is decreased, thereby reducing light extraction efficiency, which is problematic.

Accordingly, the related-art methods of controlling the surface structure have limited ability to improve the scattering characteristic.

The information disclosed in the Background of the Invention section is provided only for better understanding of the background of the invention, and should not be taken as an acknowledgment or any form of suggestion that this information forms a prior art that would already be known to a person skilled in the art.

BRIEF SUMMARY OF THE INVENTION

Various aspects of the present invention provide a metal oxide thin film substrate which can increase light trapping efficiency and light extraction efficiency, a method of fabricating the same and a photovoltaic cell and organic light-emitting device (OLED) including the same.

The present invention also provides a metal oxide thin film substrate which can realize both a light trapping effect and a light extraction effect, a method of fabricating the same and a photovoltaic cell and OLED including the same.

The present invention also provides a metal oxide thin film substrate which can improve both optical characteristics and electrical characteristics, a method of fabricating the same and a photovoltaic cell and OLED including the same.

In an aspect of the present invention, provided is a metal oxide thin film substrate that includes a base substrate; and a metal oxide thin film formed on the base substrate, the metal oxide thin film having voids which are formed inside the metal oxide thin film to scatter light.

According to an exemplary embodiment of the invention, the metal oxide thin film may include a first metal oxide thin film formed on the base substrate, and having a first texture on a surface thereof; and a second metal oxide thin film formed on the first metal oxide thin film, and having a second texture on a surface of thereof. The second metal oxide thin film includes an assembly of unit elements, the width of each of the unit elements increasing in the direction toward the top. The second metal oxide thin film defines the voids together with the first metal oxide thin film.

The voids may be connected to each other in the direction parallel to the base substrate.

The width of each of the voids may range from 50 to 400 nm.

The metal oxide thin film may be made of a material, the refractive index of which is higher than the refractive index (1.0) of the voids, so as to increase a scattering characteristic.

The metal oxide thin film may be made of one selected from the group consisting of ZnO, $SnO_2$, $SiO_2$, $TiO_2$ and NiO.

The metal oxide thin film may be doped with an n-type or p-type dopant.

The metal oxide thin film may be made of one selected from the group consisting of n-type ZnO doped with at least one of Ga, Al and F, F-doped $SnO_2$, $SiO_2$ doped with an electron donor element or a hole element, $TiO_2$ doped with an electron donor element, and NiO doped with an electron donor element.

The metal oxide thin film may be made of one selected from the group of metal oxides consisting of $CuAlO_2$, $CuGaO_2$, $CuInO_2$, $SrCu_2O_2$ and LaCuOA (A=chalcogen).

The sheet resistance of the metal oxide thin film may range from 2 to 20$\Omega/\square$.

The haze value of the metal oxide thin film may range from 3 to 100%.

In another aspect of the present invention, provided is a method of fabricating a metal oxide thin film substrate. The method includes the following steps of: growing a first metal oxide thin film on a base substrate; and growing a second metal oxide thin film in situ on the first metal oxide thin film. The second metal oxide thin film includes an assembly of unit elements, the width of each of the unit elements increasing in the direction toward the top. The second metal oxide thin film defines voids together with the first metal oxide thin film.

The step of growing the first metal oxide thin film and the step of growing the second metal oxide thin film can be carried out by atmospheric pressure chemical vapor deposition (APCVD).

The method may further include the step of doping each of the first metal oxide thin film and the second metal oxide thin film with a dopant.

In a further aspect of the present invention, provided is a photovoltaic cell that includes the above-described metal oxide thin film substrate for a transparent electrode substrate.

In a further aspect of the present invention, provided is an organic light-emitting device (OLED) that includes the above-described metal oxide thin film substrate for a light extraction layer substrate.

As set forth above, the present invention can increase light scattering using the void structure which is formed at the interface between metal oxide thin films of the multilayer structure, thereby improving the light trapping efficiency or the light extraction efficiency.

In addition, the present invention can increase the light trapping efficiency of a photovoltaic cell when it is applied for a transparent electrode of a photovoltaic cell and increase the light extraction efficiency of an OLED when it is applied for a light extraction layer of the OLED.

The metal oxide thin film substrate according to an embodiment of the present invention can realize both the light trapping effect and the light extraction effect, and can improve the electrical characteristics. In addition, it is possible to improve the scattering characteristic without decreasing the transmission characteristic, and it is also possible to reduce the thickness.

Furthermore, it is possible to fabricate the metal oxide thin film substrate in situ by atmospheric pressure chemical vapor deposition (APCVD), thereby reducing the process time.

In addition, it is possible to use the metal oxide that is less expensive than traditional indium tin oxide (ITO) for the formation of a light trapping thin film and/or a light extraction thin film, thereby reducing fabrication cost.

The methods and apparatuses of the present invention have other features and advantages which will be apparent from, or are set forth in greater detail in the accompanying drawings, which are incorporated herein, and in the following Detailed Description of the Invention, which together serve to explain certain principles of the present invention.

BRIEF DESCRIPTION OF THE DRAWINGS

FIG. 10 is a process view showing a method of fabricating a metal oxide thin film substrate according to an embodiment of the invention.

DETAILED DESCRIPTION OF THE INVENTION

Figure 1:
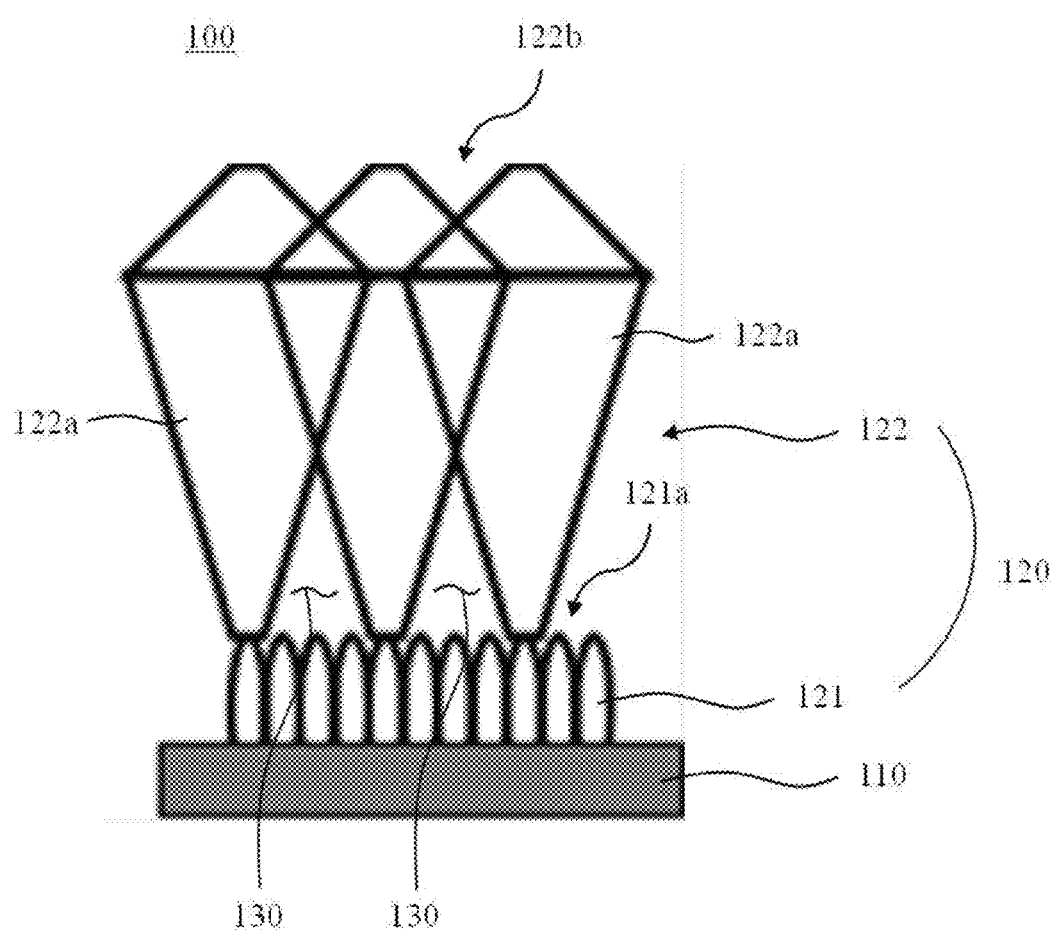
FIG. 1 is a cross-sectional view showing a metal oxide thin film substrate according to an embodiment of the invention.
Figure 2A:
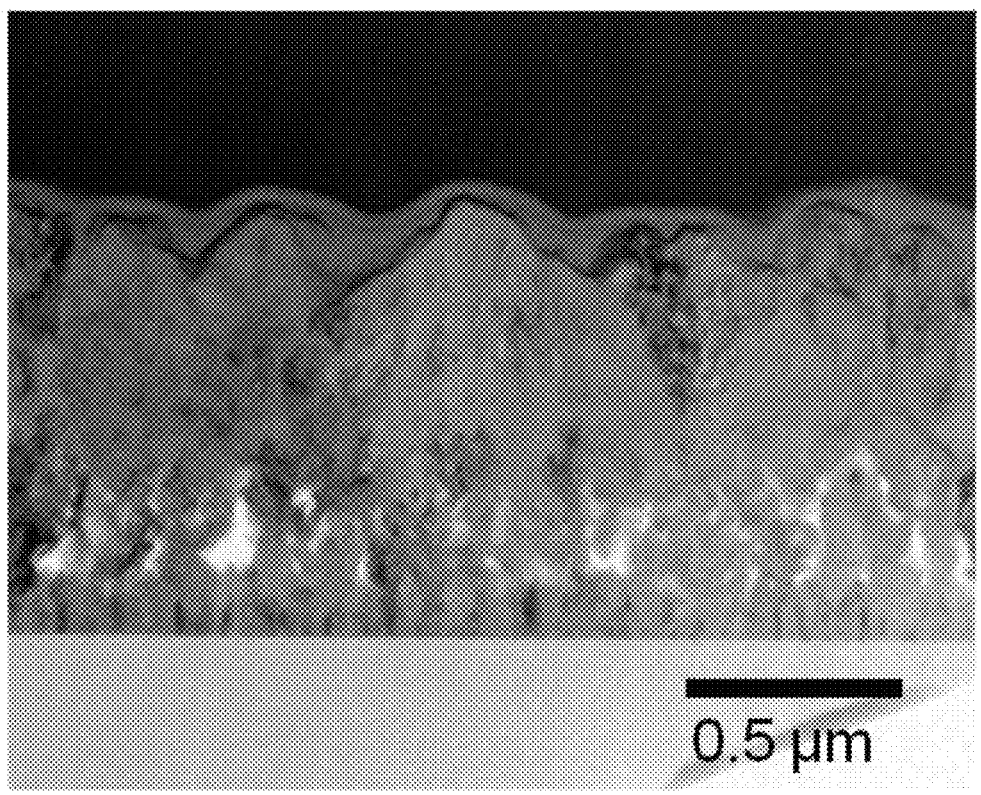
FIGS. 2A-2D are transmission electron microscopy (TEM) pictures taken from a metal oxide thin film substrate according to an embodiment of the present invention which is applied for a transparent electrode substrate of a photovoltaic cell and a three-dimensional (3D) view thereof.
Figure 2B:
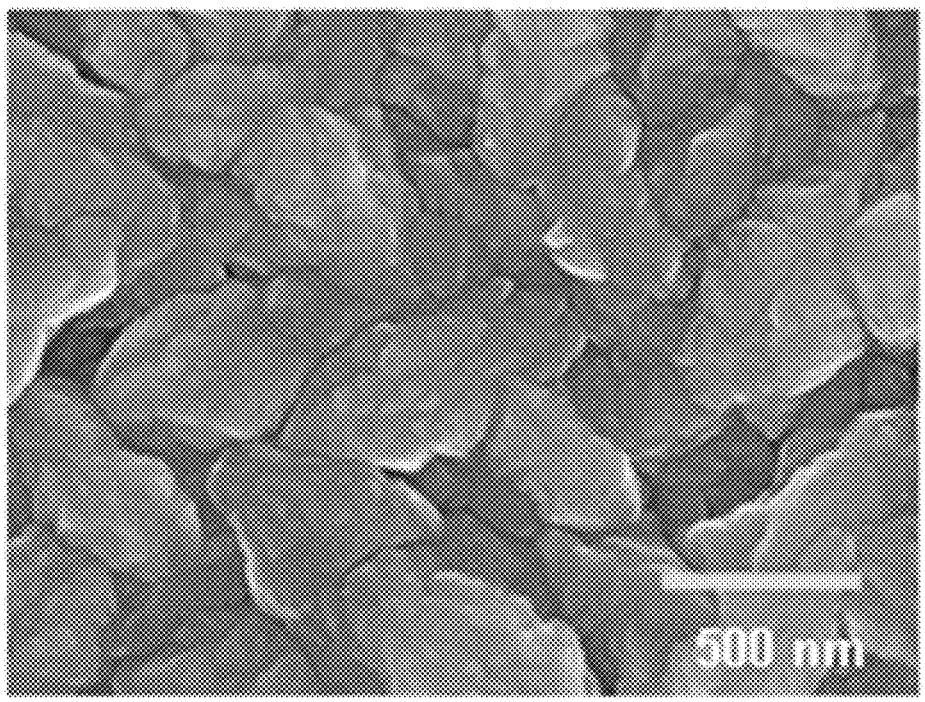
Figure 2C:
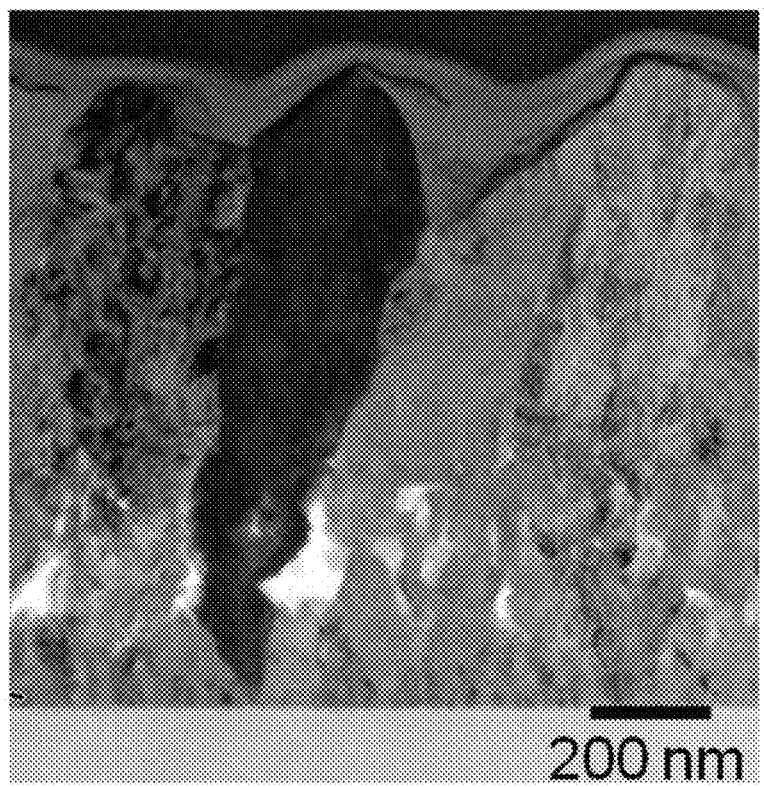
Figure 2D:
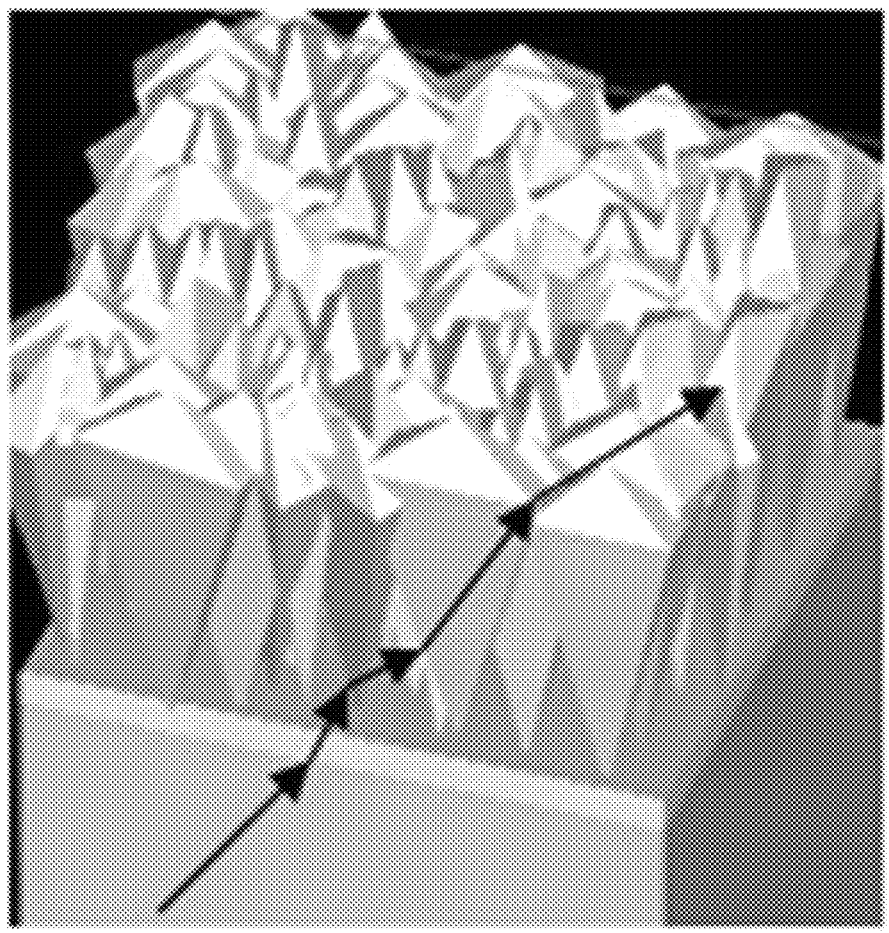

Reference will now be made in detail to a metal oxide thin film substrate, a method of fabricating the same and a photovoltaic cell and organic light-emitting device (OLED) including the same according to the present invention, embodiments of which are illustrated in the accompanying drawings and described below, so that a person having ordinary skill in the art to which the present invention relates can easily put the present invention into practice.

Throughout this document, reference should be made to the drawings, in which the same reference numerals and signs are used throughout the different drawings to designate the same or similar components. In the following description of the present invention, detailed descriptions of known functions and components incorporated herein will be omitted when they may make the subject matter of the present invention unclear.

Figure 3A:
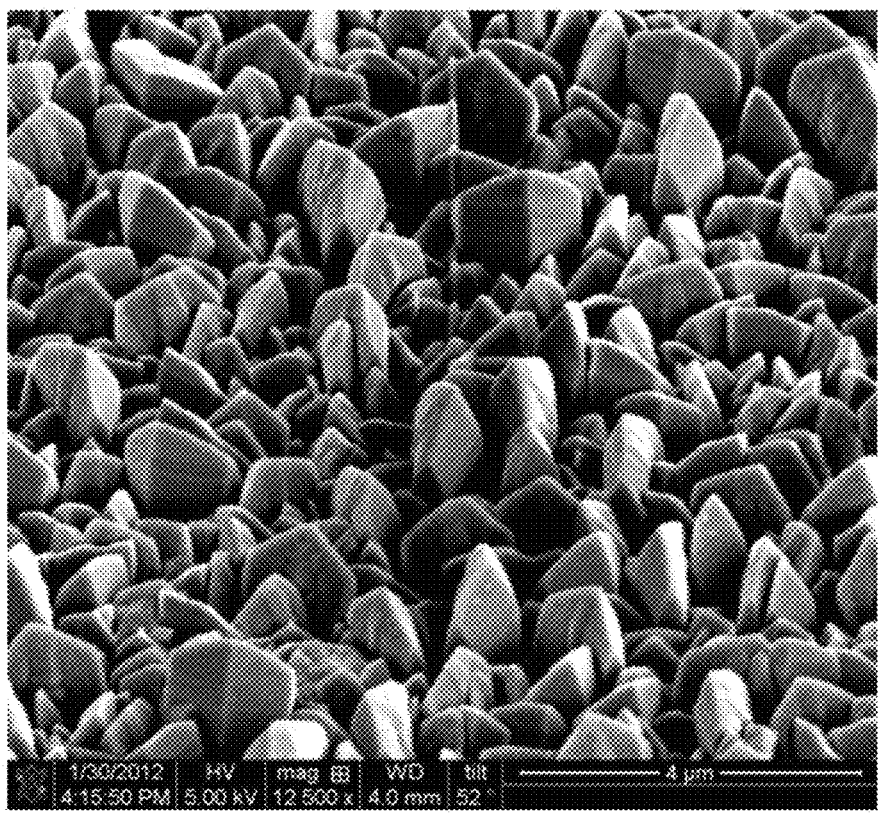
FIGS. 3A-3C are TEM pictures taken from a metal oxide thin film substrate which is applied for a transparent electrode substrate of an organic light-emitting device (OLED)
Figure 3B:
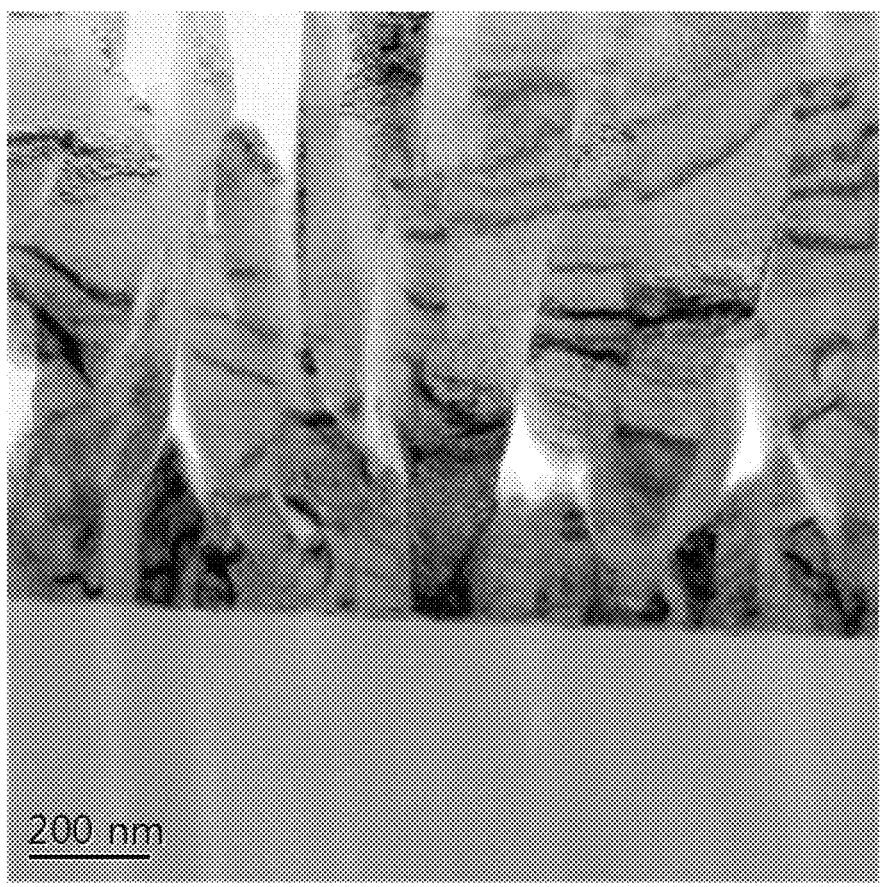
Figure 3C:
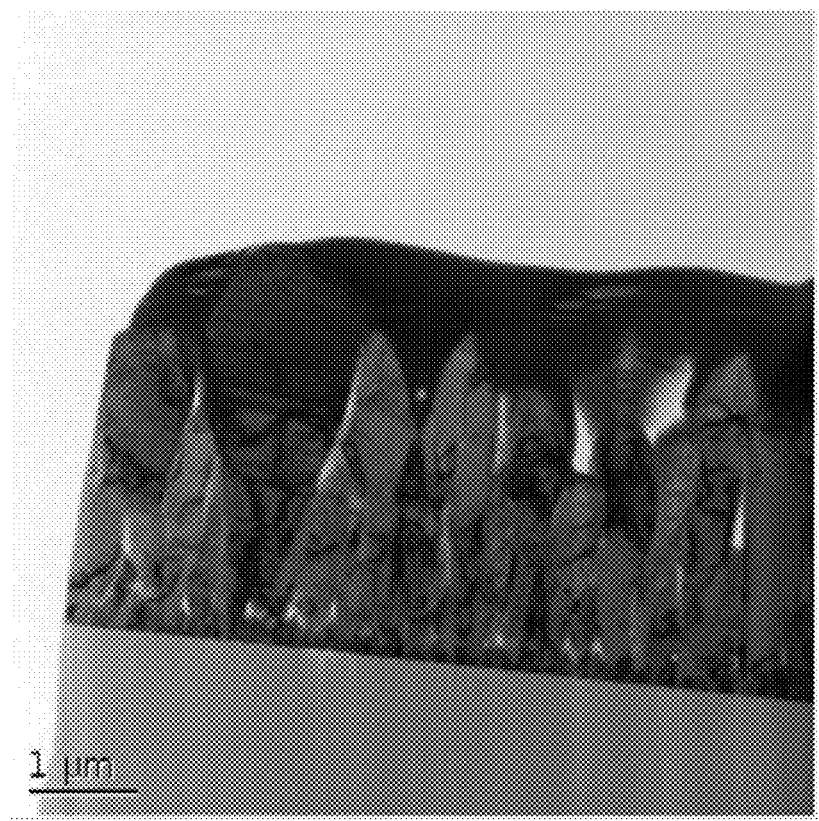

Referring to FIG. 1 to FIG. 3, a metal oxide thin film substrate 100 according to an embodiment of the present invention includes a base substrate 110 and a metal oxide thin film 120. Here, FIG. 2 is transmission electron microscopy (TEM) pictures taken from a metal oxide thin film substrate according to an embodiment of the present invention which is applied for a transparent electrode substrate of a photovoltaic cell and a three-dimensional (3D) view thereof, and FIG. 3 is TEM pictures taken from a metal oxide thin film substrate which is applied for a transparent electrode substrate of an OLED. The metal oxide thin film shown in FIG. 2 differs from the metal oxide thin film shown in FIG. 3 only in the thickness. That is, the thickness of the metal oxide thin film shown in FIG. 2 which is applied for a transparent electrode can be about 1 μm or less, and the thickness of the metal oxide thin film shown in FIG. 3 which is applied for a light extraction layer of an OLED can be about 2 μm or greater.

The base substrate 110 is a substrate which supports the metal oxide thin film 120 which is formed on one surface thereof. The base substrate 110 is a transparent substrate, and can be implemented as any substrate that has superior light transmittance and superior mechanical properties. For instance, the base substrate 110 can be made of a polymeric material, such as an organic film, that is thermally curable or ultraviolet (UV) curable or a chemically-tempered glass, such as a soda-lime glass ($SiO_2$—CaO—$Na_2O$) or an aluminosilicate glass (SiO$_2$—Al$_2$O$_3$—Na$_2$O). For instance, according to an embodiment of the present invention, the base substrate 110 can be made of a soda-lime glass when the OLED which uses the metal oxide thin film substrate 100 for a light extraction layer substrate is for illumination or can be made of an aluminosilicate glass when the OLED is for a display. In addition, the base substrate 110 can be implemented as a substrate that is made of a metal oxide or a metal nitride.

According to an embodiment of the present invention, the base substrate 110 can be implemented as a laminated glass that has a thickness of 1.5 mm or less. Such a laminated glass can be fabricated by a fusion process or a floating process.

The metal oxide thin film 120 is formed on one surface of the base substrate 110. The metal oxide thin film 120 can be deposited on one surface of the base substrate 110 by atmospheric pressure chemical vapor deposition (APCVD), which will be discussed in more detail in relation to the method of fabricating the metal oxide thin film substrate, which will be described later.

According to an embodiment of the present invention, voids 130 are formed inside the metal oxide thin film 120. Since the refractive index of the voids 130 differs from the refractive index of the metal oxide thin film 120, the voids 130 serve to scatter light that passes through the metal oxide thin film 120. For instance, when the metal oxide thin film substrate 100 according to an embodiment of the present invention is applied for a transparent conductive oxide electrode substrate of a photovoltaic cell, the diffused reflection or light scattering effect of the voids 130 can improve the light trapping efficiency of the photovoltaic cell. When the metal oxide thin film substrate 100 according to an embodiment of the present invention is applied for a light extraction layer substrate of an OLED, the light scattering effect of the voids 130 can improve the light extraction efficiency of the OLED. In this way, the metal oxide thin film substrate 100 according to an embodiment of the present invention can realize both the light trapping effect and the light extraction effect due to the voids 130.

Since the refractive index of the voids 130 which are air gaps is 1.0, the metal oxide thin film 120 can be made of a material, the refractive index of which is greater than the refractive index of the voids 130, in order to improve the scattering characteristic. For instance, the metal oxide thin film 120 can be made of one selected from among, but not limited to, ZnO, SnO$_2$, SiO$_2$, TiO$_2$ and NiO. Here, it is possible to add an n-type or p-type dopant into the metal oxide thin film 120 in order to improve the electrical characteristics. For instance, the metal oxide thin film 120 can be made of one selected from among, but not limited to, n-type ZnO doped with at least one of Ga, Al and F, F-doped SnO$_2$, SiO$_2$ doped with an electron donor element or a hole element, TiO$_2$ doped with an electron donor element, and NiO doped with an electron donor element. In addition, the metal oxide thin film 120 can be made of one selected from among p-type metal oxides, such as CuAlO$_2$, CuGaO$_2$, CuInO$_2$, SrCu$_2$O$_2$ and LaCuOA (A=chalcogen). When the metal oxide thin film 120 is made of an n-type or p-type oxide, the sheet resistance of the metal oxide thin film 120 can range from 2 to 20Ω/□.

Here, the voids 130 can be formed due to the structural factors of the metal oxide thin film 120 which forms a multilayer. Describing in more detail, the metal oxide thin film 120 can have a multilayer structure including a first metal oxide thin film 121 and a second metal oxide thin film 122. The first metal oxide thin film 121 is disposed on the base substrate 110, and forms a base layer of the metal oxide thin film 120. The first metal oxide thin film 121 has a texture 121a on the surface thereof which can be naturally formed during atmospheric pressure chemical vapor deposition (APCVD). The texture 121a serves to scatter light that passes through the metal oxide thin film 120 like the voids 130. Thus, the texture 121a increases the haze value of the metal oxide thin film 120. According to an embodiment of the present invention, the texture 121a can have the shape of a variety of polyhedrons, such as a rod, a half-hexagon or a hexagonal prism, or can have a random shape.

In addition, the second metal oxide thin film 122 is formed on the first metal oxide thin film 121. As shown in the figure, the second metal oxide thin film 122 can be an assembly of unit elements 122a, the width of each of which increases in the direction toward the top. As shown in FIG. 1, each unit element 122a can be configured such that the vertical cross-sectional shape is substantially an upside-down trapezoid and the horizontal cross-sectional shape is a polygon, for example, a hexagon. When the second metal oxide thin film 122 is formed as such, a plurality of voids 130 is formed such that the bottom of each void 130 is defined by the first metal oxide thin film 121 and walls of each void 130 are defined by the adjacent unit elements 122a. The plurality of voids 130 can be connected to each other in the direction parallel to the base substrate 110. For instance, when the substrate is viewed from above, the shape of the voids that are connected to each other can be substantially that of a net. In addition, the voids 130 can be defined by the unit elements 122a such that their cross-sectional shape is substantially a triangle. For instance, the bottom-side width of the triangular shape can range from about 50 to about 400 nm. At this size, the voids 130 can scatter light in the visible light wavelength range. While 50 nm seems too small to scatter light in the visible light wavelength range, sufficient scattering characteristic can be realized in practice since the voids 130 are two-dimensionally connected to each other. In addition, the height of the voids 130 can differ depending on the shape of the unit elements 122a that are grown.

The unit elements 122a of the second metal oxide thin film 122 are configured such that the upper ends thereof overlap each other in the lateral direction. Each upper portion of the unit elements 122a has a convex or sharp shape. This consequently forms a texture 122b on the surface of the upper end of the second metal oxide thin film 122 like on the surface of the first metal oxide thin film 121, the texture 122b scattering light that passes through the metal oxide thin film 120.

Accordingly, the metal oxide thin film 120 can exhibit superior light efficiency, i.e. superior light trapping efficiency or superior light extraction efficiency, since the texture 121 formed on the surface of the first metal oxide thin film 121, the voids 130 and the texture 122b formed on the second metal oxide thin film 122 change the light scattering paths into a very complicated shape. Here, the haze value of the metal oxide thin film 120 according to an embodiment of the invention can range from 3 to 100%.

As described above, the metal oxide thin film substrate 100 which includes the base substrate 110 and the metal oxide thin film 120 can diversify or increase the scattering paths of light that passes through the metal oxide thin film 120 based on the structure including the textures 121a and 122b and the voids 130, thereby improving the light scattering efficiency or the light extraction efficiency of a photovoltaic cell or an OLED which includes the same. In addition, the electrical characteristics can also be improved when a dopant is added at a predetermined ratio.

Figure 4:
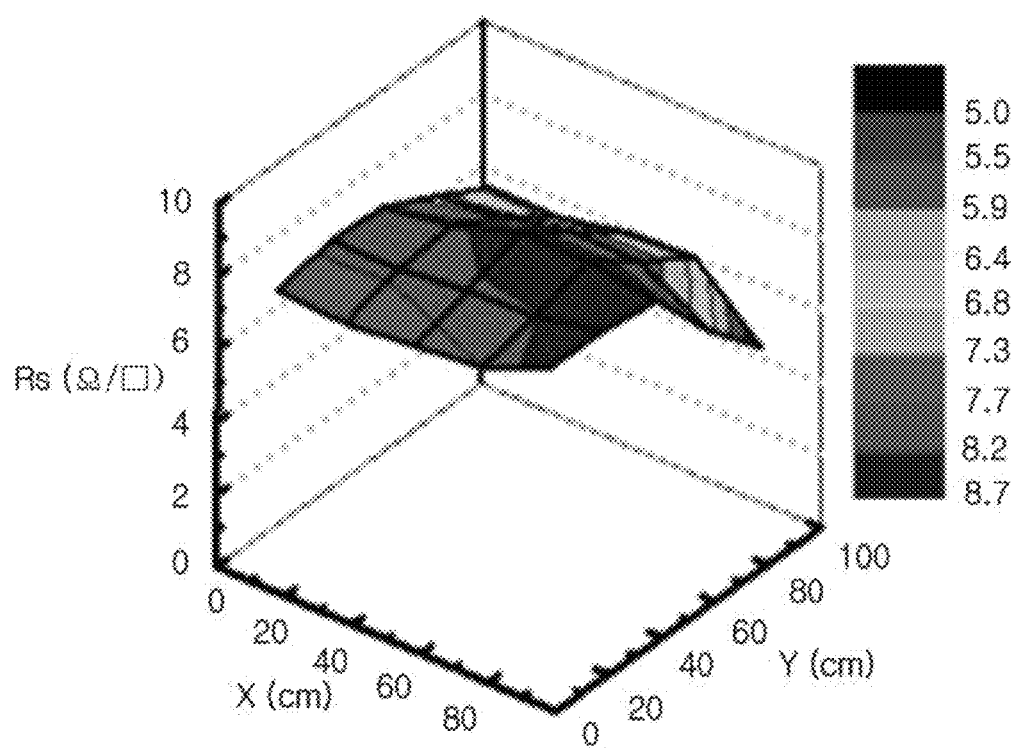
FIG. 4 is a view showing the electrical characteristics of a metal oxide thin film substrate according to an embodiment of the invention which is applied for a transparent electrode substrate of a photovoltaic cell.

FIG. 4 is a view showing the electrical characteristics, i.e. the measurement result of the sheet resistance, of a metal oxide thin film substrate according to an embodiment of the invention which is applied for a transparent electrode substrate of a photovoltaic cell. It is proven that the metal oxide thin film according to an embodiment of the invention has a superior sheet resistance of about 8Ω/□ or less.

Figure 5A:
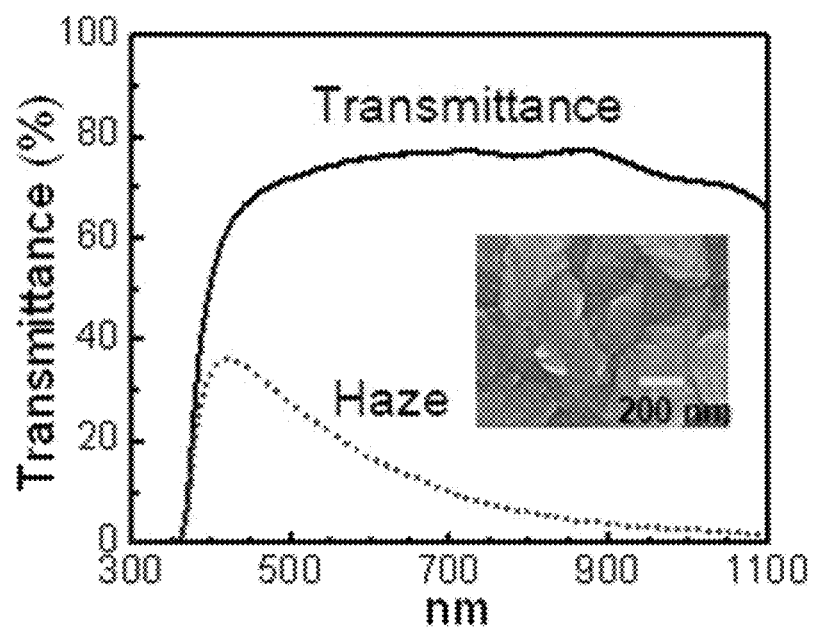
FIGS. 5A and 5B are views showing the optical characteristics of a metal oxide thin film substrate according to an embodiment of the invention and a metal oxide thin film substrate of the related art each of which is applied for a transparent electrode substrate of a photovoltaic cell.
Figure 5B:
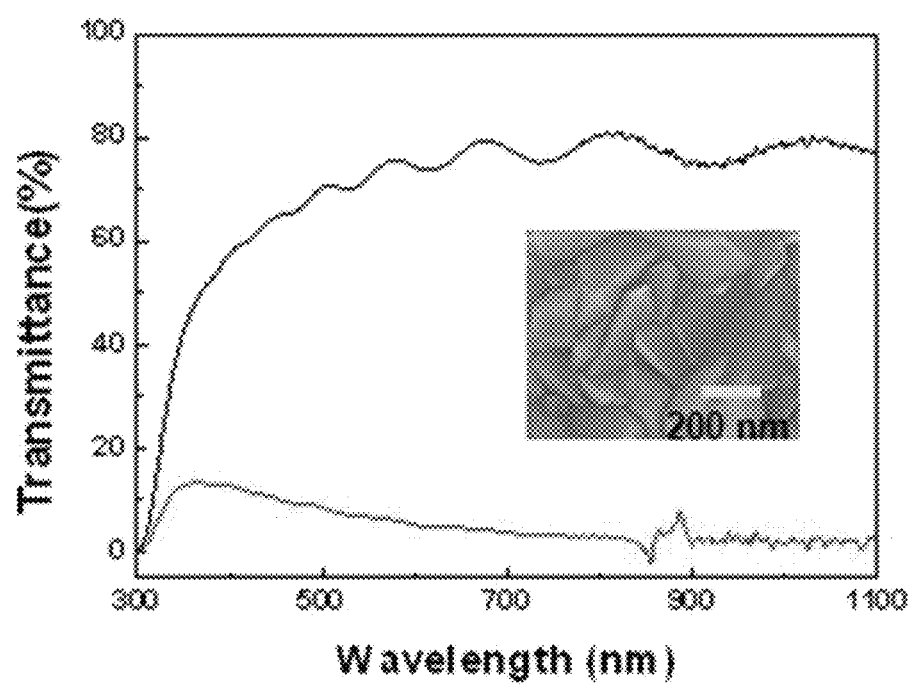

In addition, FIG. 5 is a view showing the optical characteristics of a metal oxide thin film substrate according to an embodiment of the invention and a metal oxide thin film substrate of the related art each of which is applied for a transparent electrode substrate of a photovoltaic cell. In FIG. 5, variations in transmittance and haze value with respect to wavelength are plotted. As is apparent from the graphs, the metal oxide thin film substrate according to an embodiment of the invention in the left graph (a) shows a higher haze value than the metal oxide substrate of the related art in the right graph (b) without a decrease in transmittance. It is proven that the metal oxide substrate of the related art in the right graph (b), i.e. the substrate having a texture only on the surface, has a lower haze value in the visible light wavelength range than the metal oxide thin film substrate according to an embodiment of the invention in the left graph (a).

Figure 6:
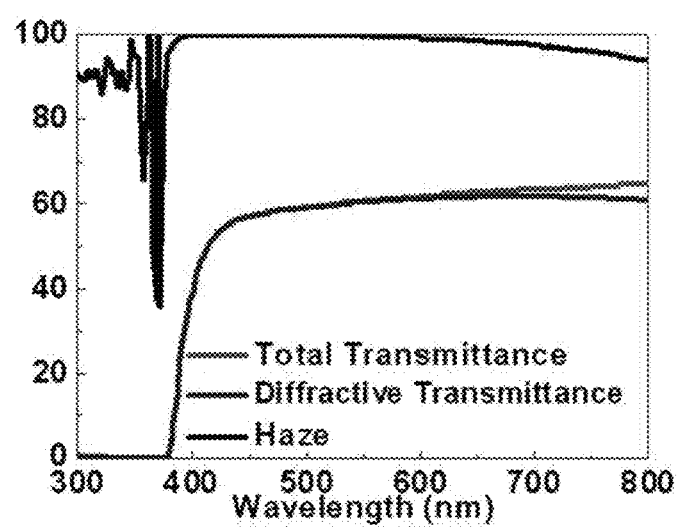
FIG. 6 is a view showing the optical characteristics of a metal oxide thin film substrate according to an embodiment of the invention which is applied for a light extraction layer substrate of an OLED.

Furthermore, FIG. 6 is a view showing the optical characteristics of a metal oxide thin film substrate according to an embodiment of the invention which is applied for a light extraction layer substrate of an OLED. Although the overall transmittance of the metal oxide thin film substrate according to an embodiment of the invention is lower than the metal oxide thin film substrate which is applied for a transparent electrode substrate of a photovoltaic cell since its thickness is greater than that of the metal oxide thin film substrate for a photovoltaic cell, it is proven that the metal oxide thin film substrate according to an embodiment of the invention has superior light extraction efficiency due to a high haze value.

Figure 7:
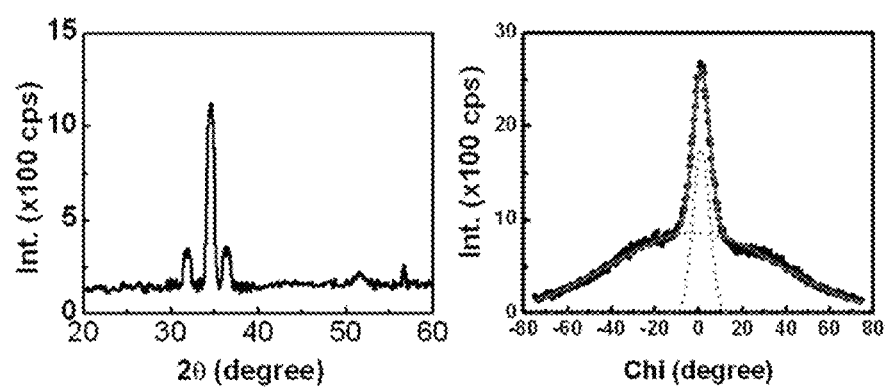
FIG. 7 is an X-ray diffraction (XRD) graph of a metal oxide thin film according to an embodiment of the invention which is applied for a transparent electrode substrate of a photovoltaic cell.
Figure 8:
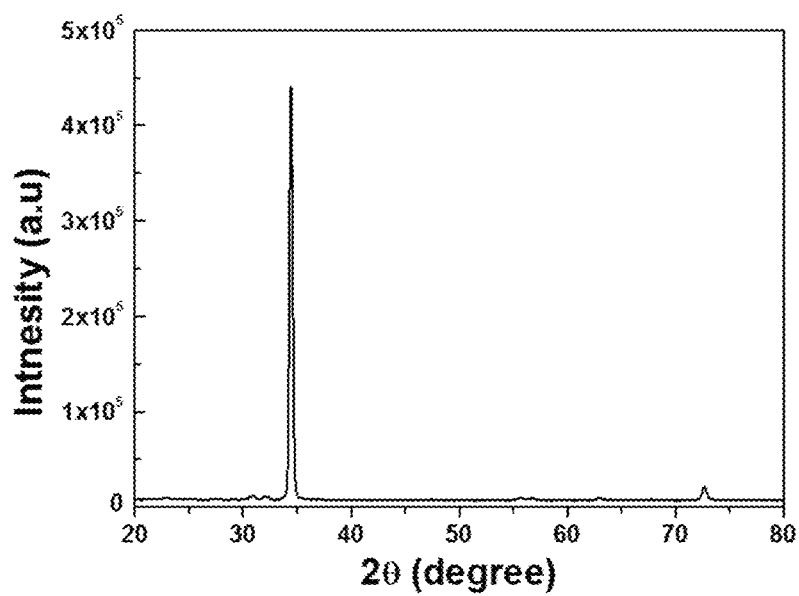
FIG. 8 is an XRD graph of a metal oxide thin film according to an embodiment of the invention which is applied for a light extraction substrate of an OLED.

In addition, FIG. 7 is an X-ray diffraction (XRD) graph of a metal oxide thin film according to an embodiment of the invention which is applied for a transparent electrode substrate of a photovoltaic cell, and FIG. 8 is an XRD graph of a metal oxide thin film according to an embodiment of the invention which is applied for a light extraction substrate of an OLED. These graphs show XRD measurements of the metal oxide thin films made of ZnO. As apparent from the graphs, the main growth direction of ZnO is the c-axis direction. The right graph shows the result of chi-scanning on the (0002) peak of the c-axis. The c-axis has a mixed structure in which a component that is grown perpendicular to the substrate and a component that is grown tilted to the substrate are mixed. From these graphs, the metal oxide thin films and their shapes can be analogized. The sharp portions on the graphs indicate the first metal oxide thin film (121 in FIG. 1), and the broad portions on the graphs indicate the second metal oxide thin film (122 in FIG. 1).

Figure 9:
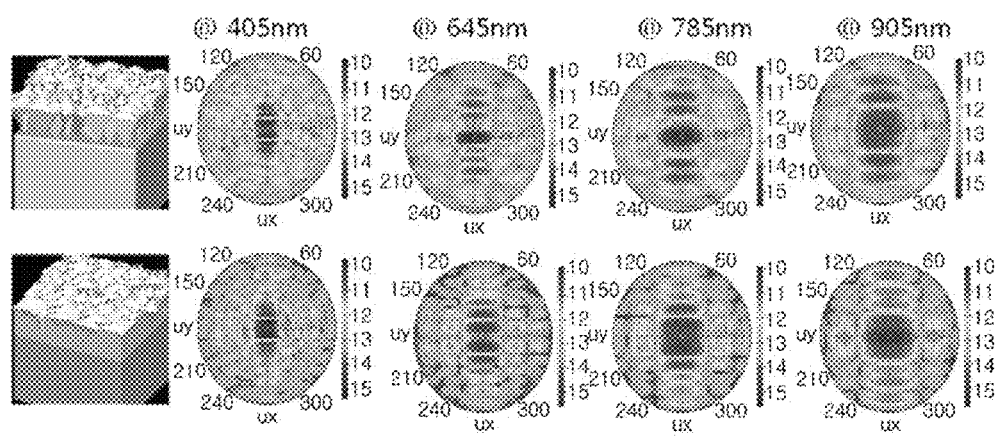
FIG. 9 shows simulation results obtained by measuring the light scattering effects depending on the wavelength of a metal oxide thin film substrate according to an embodiment of the invention and a metal oxide thin film substrate of the related art each of which is applied for a transparent electrode substrate of a photovoltaic cell.

In addition, FIG. 9 shows simulation results obtained by measuring the light scattering effects depending on the wavelength of a metal oxide thin film substrate according to an embodiment of the invention and a metal oxide thin film substrate of the related art each of which is applied for a transparent electrode substrate of a photovoltaic cell. In FIG. 9, the upper part indicates the metal oxide thin film substrate according to an embodiment of the invention, and the lower part indicates the metal oxide thin film substrate of the related art. Here, the simulation results in FIG. 9 show the scattering paths depending on the wavelength when light has passed through the substrates, in which blue indicates areas where a relatively small quantity of light was scattered, red indicates areas where scattering was concentrated, and all directions were considered in the simulations. Comparing depending on the wavelength bands, it is apparent that the red areas are more widely distributed across all wavelength bands in the metal oxide thin film substrate according to an embodiment of the invention than in the metal oxide thin film substrate of the related art. This indicates that the scattering paths of light were diversified and increased.

The metal oxide thin film substrate 100 according to an embodiment of the invention having the above-described characteristics can be formed so as to have the shape shown in FIG. 2, and can be used for a transparent conductive oxide electrode of a photovoltaic cell. Here, the photovoltaic cell is an electrical device that converts the energy of light, for example, solar energy, directly into electricity.

Although not specifically shown, a photovoltaic cell module can have a multilayer structure in which a cover glass, a first buffer member, a photovoltaic cell, a second buffer member and a rear sheet are sequentially stacked on each other. The cover glass serves to protect the photovoltaic cell from the external environment such as moisture, dust or damage. In addition, the buffer members serve to protect the photovoltaic cell from the external environment such as moisture penetration, and encapsulate the photovoltaic cell by bonding it to the cover glass. The buffer members can be made of ethylene vinyl acetate (EVA). The photovoltaic cell is formed as a power generating device which generates a voltage and current in response to, for example, sunlight. For example, the photovoltaic cell can include a transparent conductive oxide electrode, a light-absorbing layer, a back electrode layer and an insulator film. Examples of the material for the light-absorbing layer can include a semiconductor compound, such as single crystal or polycrystal silicon, copper indium gallium Selenide (CIGS) or cadmium telluride (CdTe), a dye-sensitizer in which photosensitive dye molecules are adsorbed on the surface of nano particles of a porous film such that electrons are activated when the photosensitive dye molecules absorb visible light, amorphous silicon, or the like. The metal oxide thin film 120 of the metal oxide thin film substrate 100 according to an embodiment of the invention can be applied as a transparent conductive oxide electrode of the photovoltaic cell, and the base substrate 110 can serve as a support substrate which supports the transparent conductive oxide electrode.

In addition, the metal oxide thin film substrate 100 according to an embodiment of the invention can be formed so as to have the shape shown in FIG. 3, and can be used for a light extraction layer of an OLED.

Specifically, the base substrate 110 of the metal oxide thin film substrate 100 serves as one of a pair of opposing encapsulation substrates of an GELD, and the metal oxide thin film 120 formed on one surface of the base substrate 110 serves as a light extraction layer. Here, the metal oxide thin film 120 can be used for an external light extraction layer, and can be used for an internal light extraction layer that adjoins an anode of the OLED. When the metal oxide thin film 120 is used for the internal light extraction layer of the OLED, the texture 122*b* on the surface can be transferred to the surface of the anode, thereby creating a leakage current. Therefore, when the metal oxide thin film 120 is used for the internal light extraction layer of the OLED, a planarization layer can be situated between the anode and the metal oxide thin film 120.

Although not shown, the OLED will be described in brief. The OLED has a multilayer structure which is situated between encapsulation substrates which face each other, the multilayer structure including an anode, an organic light-emitting layer and a cathode. Here, the anode can be made of a metal or oxide, such as Au, In, Sn or indium tin oxide (ITO), that has a large work function in order to facilitate hole injection. The cathode can be implemented as a metal thin film of Al, Al:Li or Mg:Ag that has a low work function in order to facilitate injection of electrons. When the OLED has a top emission structure, the cathode can have a multilayer structure that includes a semitransparent electrode of a metal thin film of Al, Al:Li or Mg:Ag and a transparent electrode of an oxide thin film of ITO in order to facilitate transmission of light that is generated by the organic light-emitting layer. In addition, the organic light-emitting layer includes a hole injection layer, a hole transport layer, am emissive layer, an electron transport layer and an electron injection layer which are sequentially stacked on the anode. According to this structure, when a forward voltage is applied between the anode and the cathode, electrons from the cathode migrate to the emitting layer through the electron injection layer and the electron transport layer, and holes from the anode migrate to the emissive layer through the hole injection layer and the hole transport layer. The electrons and holes that have migrated into the emitting layer recombine with each other, thereby generating excitons. When such excitons transit from the excited state to the ground state, light is emitted. The brightness of light that is emitted as such is proportional to the amount of current that flows between the anode and the cathode.

When the metal oxide thin film substrate 100 having the increased light scattering effect is applied for a transparent conductive oxide electrode of a multilayer photovoltaic cell or a light extraction layer of an OLED, it is possible to further improve the optical characteristics of these devices, that is, the light trapping efficiency and the light extraction efficiency.

Reference will now be made to a method of fabricating a metal oxide thin film substrate according to an embodiment of the invention with reference to FIG. 10.

As shown in FIG. 10, the method of fabricating a metal oxide thin film substrate according to an embodiment of the invention includes, first, growing a first metal oxide thin film 121 on a base substrate 110. Here, the first metal oxide thin film 121 can be made of one selected from among $ZnO$, $SnO_2$, $SiO_2$, $TiO_2$ and NiO; one selected from among G-doped n-type elements, such as $ZnO$, $SnO_2$, $SiO_2$, $TiO_2$ and NiO; one selected from among n-type ZnO doped with at least one of Ga, Al and F, F-doped $SnO_2$, $SiO_2$ doped with an electron donor element or a hole element, $TiO_2$ doped with an electron donor element, and NiO doped with an electron donor element; or a p-type metal oxide selected from among $CuAlO_2$, $CuGaO_2$, $CuInO_2$, $SrCu_2O_2$ and LaCuOA (A=chalcogen). The first metal oxide thin film 121 made of one of these metal oxides is deposited by a APCVD process.

The APCVD process includes, first, loading the base substrate 110 into a process chamber (not shown), and then heating the base substrate 110 to a predetermined temperature. Afterwards, a precursor gas and an oxidizer gas that will form the first metal oxide thin film 121 are blown into the process chamber (not shown). In this case, it is preferable to control the precursor gas and the oxidizer gas to be fed along different paths in order to prevent the gases from mixing before entering the process chamber (not shown). The precursor gas and the oxidizer gas can be preheated before being fed in order to promote a chemical reaction. The precursor gas can be fed on a carrier gas into the process chamber (not shown), the carrier gas being implemented as an inert gas such as nitrogen, helium or argon.

When the first metal oxide thin film 121 is deposited by the APCVD process as such, a texture 121a is naturally formed on the surface of the first metal oxide thin film 121.

Afterwards, a second metal oxide thin film 122 made of the same material as the first metal oxide thin film 121 is deposited in situ on the first metal oxide thin film 121. At this time, the second metal oxide thin film 122 having an assembly of a plurality of unit elements 122a is grown on the first metal oxide thin film 121 by controlling the ratios of the precursor gas and the oxidizer gas, the amount of the precursor, a growth temperature and the like. Comparing to the process of depositing the first metal oxide thin film, the process of depositing the second metal oxide thin film forms voids by increasing the growth rate by increasing the amounts of the precursor gas and the oxidizer gas and raising the growth temperature. When the second metal oxide thin film 122 is grown in this shape, a plurality of voids 130 is formed at the interface between the first metal oxide thin film 121 and the second metal oxide thin film 122 along the direction parallel to the base substrate 110. Here, the APCVD process also forms a texture 122b on the surface of the second metal oxide thin film 122.

When the first metal oxide thin film 121 and the second metal oxide thin film 122 are sequentially deposited in situ on the base substrate 110 by the APCVD process as described above, the fabrication of the metal oxide thin film substrate 100 according to an embodiment of the invention is completed.

The foregoing descriptions of specific exemplary embodiments of the present invention have been presented with respect to the drawings. They are not intended to be exhaustive or to limit the invention to the precise forms disclosed, and obviously many modifications and variations are possible for a person having ordinary skill in the art in light of the above teachings.

It is intended therefore that the scope of the invention not be limited to the foregoing embodiments, but be defined by the Claims appended hereto and their equivalents.

What is claimed is:

1. A metal oxide thin film substrate comprising:
a base substrate; and
a metal oxide thin film formed on the base substrate, the metal oxide thin film having voids which are formed inside the metal oxide thin film to scatter light,
wherein the metal oxide thin film comprises:
a first metal oxide thin film formed on the base substrate and having a first texture on a surface thereof; and
a second metal oxide thin film formed on the first metal oxide thin film and having a second texture on a surface thereof, the second metal oxide thin film comprising an assembly of unit elements each having a polyhedron shape and each having a plurality of faces each having a polygon shape, a width of each of the unit elements between respective faces of each unit element increasing in a direction toward an upper end of the unit element such that the faces of the polyhedrons of the unit elements of the second metal oxide thin film define the voids together with the first metal oxide thin film.

2. The metal oxide thin film substrate of claim 1, wherein the voids are connected to each other in a direction parallel to the base substrate.

3. The metal oxide thin film substrate of claim 2, wherein a width of each of the voids ranges from 50 to 400 nm.

4. The metal oxide thin film substrate of claim 1, wherein the metal oxide thin film comprises a material, a refractive index of which is higher than a refractive index (1.0) of the voids, so as to increase a scattering characteristic.

5. The metal oxide thin film substrate of claim 4, wherein the metal oxide thin film comprises one selected from the group consisting of $ZnO$, $SnO_2$, $SiO_2$, $TiO_2$ and NiO.

6. The metal oxide thin film substrate of claim 5, wherein the metal oxide thin film is doped with an n-type or p-type dopant.

7. The metal oxide thin film substrate of claim 6, wherein the metal oxide thin film comprises one selected from the group consisting of n-type ZnO doped with at least one of Ga, Al and F, F-doped $SnO_2$, $SiO_2$ doped with an electron donor element or a hole element, $TiO_2$ doped with an electron donor element, and NiO doped with an electron donor element.

8. The metal oxide thin film substrate of claim 5, wherein a sheet resistance of the metal oxide thin film ranges from 2 to 20Ω/□.

9. The metal oxide thin film substrate of claim 4, wherein the metal oxide thin film comprises one selected from the group of metal oxides consisting of $CuAlO_2$, $CuGaO_2$, $CuInO_2$, $SrCu_2O_2$ and LaCuOA (A=chalcogen).

10. The metal oxide thin film substrate of claim 1, wherein a haze value of the metal oxide thin film ranges from 3 to 100%.

11. A photovoltaic cell comprising a metal oxide thin film substrate recited in claim 1 as a transparent electrode substrate.

12. An organic light-emitting device comprising a metal oxide thin film substrate recited in claim 1 as a light extraction layer substrate.

\* \* \* \* \*